United States Patent
Wang et al.

(10) Patent No.: US 10,242,893 B2
(45) Date of Patent: Mar. 26, 2019

(54) METHOD AND APPARATUS FOR DE-CHUCKING A WORKPIECE USING A SWING VOLTAGE SEQUENCE

(71) Applicant: Applied Materials, Inc., Santa Clara, CA (US)

(72) Inventors: Haitao Wang, Fremont, CA (US); Wonseok Lee, Saratoga, CA (US); Sergio Fukuda Shoji, San Jose, CA (US); Chunlei Zhang, Santa Clara, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/628,396

(22) Filed: Jun. 20, 2017

(65) Prior Publication Data
US 2018/0366359 A1 Dec. 20, 2018

(51) Int. Cl.
*H01L 21/67* (2006.01)
*H01L 21/683* (2006.01)

(52) U.S. Cl.
CPC .... *H01L 21/67259* (2013.01); *H01L 21/6831* (2013.01); *Y10T 29/49998* (2015.01); *Y10T 279/23* (2015.01)

(58) Field of Classification Search
CPC ........... H01L 21/67259; H01L 21/6831; Y10T 29/49998; Y10T 279/23
See application file for complete search history.

(56) References Cited

U.S. PATENT DOCUMENTS

| 5,184,398 | A | * | 2/1993 | Moslehi | C23C 16/4583 |
| | | | | | 257/E21.531 |
| 5,474,614 | A | * | 12/1995 | Robbins | B25B 11/002 |
| | | | | | 118/728 |
| 5,491,603 | A | | 2/1996 | Birang et al. | |
| 5,857,456 | A | * | 1/1999 | Sun | A61M 15/0045 |
| | | | | | 128/203.12 |
| 6,005,376 | A | * | 12/1999 | Mett | G05F 1/46 |
| | | | | | 323/275 |
| 6,252,758 | B1 | * | 6/2001 | Nagao | G03F 7/70691 |
| | | | | | 279/128 |
| 7,292,428 | B2 | * | 11/2007 | Hanawa | H01L 21/6831 |
| | | | | | 361/234 |
| 7,422,775 | B2 | * | 9/2008 | Ramaswamy | H05H 1/46 |
| | | | | | 427/572 |

(Continued)

*Primary Examiner* — Eric A Gates
(74) *Attorney, Agent, or Firm* — Schwabe, Williamson & Wyatt, P.C.

(57) ABSTRACT

A method and apparatus for de-chucking a workpiece is described that uses a swing voltage sequence. One example pertains to a method that includes applying a mechanical force from an electrostatic chuck against the back side of a workpiece that is electrostatically clamped to the chuck, applying a sequence of voltage pulses with a same polarity to the electrodes, each pulse of the sequence having a lower voltage than the preceding pulse, each pulse of the sequence having a lower voltage than the preceding pulse, and determining whether the workpiece is released from the chuck after the sequence of additional voltage pulses and if the workpiece is not released then repeating applying the sequence of voltage pulses.

12 Claims, 4 Drawing Sheets

(56) References Cited

U.S. PATENT DOCUMENTS

| | | | |
|---|---|---|---|
| 7,465,478 B2* | 12/2008 | Collins | H01J 37/32082 |
| | | | 427/490 |
| 7,479,456 B2* | 1/2009 | Buchberger, Jr. | ............................ |
| | | | H01L 21/67109 |
| | | | 438/706 |
| 7,968,439 B2* | 6/2011 | Li | C23C 14/48 |
| | | | 257/E21.057 |
| 8,164,879 B2 | 4/2012 | Sheng et al. | |
| 8,734,664 B2* | 5/2014 | Yang | H01J 37/32082 |
| | | | 216/67 |
| 9,399,812 B2* | 7/2016 | Bodke | C23C 14/046 |
| 9,761,419 B2* | 9/2017 | Nagami | H01J 37/32715 |
| 9,991,147 B2* | 6/2018 | Wang | H01L 21/6831 |
| 2009/0109595 A1* | 4/2009 | Herchen | H01L 21/6831 |
| | | | 361/234 |
| 2010/0072172 A1* | 3/2010 | Ui | H01J 37/32009 |
| | | | 216/67 |
| 2013/0153147 A1 | 6/2013 | Senzaki et al. | |
| 2016/0116518 A1* | 4/2016 | Wang | G01R 29/24 |
| | | | 324/457 |
| 2018/0233393 A1* | 8/2018 | Liu | H01L 21/6833 |

* cited by examiner

METHOD AND APPARATUS FOR DE-CHUCKING A WORKPIECE USING A SWING VOLTAGE SEQUENCE

FIELD

Embodiments of the present description relates to microelectronics manufacturing and in particular to releasing a processed workpiece from an electrostatic chuck.

BACKGROUND

In semiconductor processing, a silicon wafer or other type of flat workpiece is exposed to sequence of processes to form layers and pattern of conductive and dielectric materials. These materials make up the transistors, connections, and other components of the eventual semiconductor die. The processes are performed in several different processing chambers. A chuck, carrier, pedestal, or another type of holder is used to hold the wafer as it is moved between chambers. The wafer may be carried by one carrier and then transferred to another carrier as it moves from one process to another.

An electrostatic chuck (ESC) is widely used as a holder to clamp on to a silicon or similar type of dielectric wafer in semiconductor plasma process chambers. The ESC uses an electrostatic force to grip the wafer during plasma and during other types of processes. At the end of a process or when the wafer is to be transferred to a different carrier, the electrostatic charge is discharged so that the wafer can be released from the ESC.

A two-step voltage sequence is sometimes used to de-chuck a wafer. The voltage sequence is to eliminate the electrostatic charge of the chuck that is applied to the wafer. The voltage sequence may be combined with a gentle helium gas pressure against the back side of the wafer to push it away from the chuck.

SUMMARY

A method and apparatus for de-chucking a workpiece is described that uses a swing voltage sequence. One example pertains to a method that includes applying a mechanical force from an electrostatic chuck against the back side of a workpiece that is electrostatically clamped to the chuck, applying a sequence of voltage pulses with a same polarity to the electrodes, each pulse of the sequence having a lower voltage than the preceding pulse, and determining whether the workpiece is released from the chuck after the sequence of additional voltage pulses and if the workpiece is not released then repeating applying the sequence of voltage pulses.

BRIEF DESCRIPTION OF THE DRAWINGS

Embodiments of the present invention are illustrated by way of example, and not limitation, in the figures of the accompanying drawings in which.

DETAILED DESCRIPTION

A technique and apparatus is described herein to effectively de-chuck a workpiece such as a wafer using a multi-step pulsing swing voltage assisted by a back side helium gas pressure. Active control is used to control the steps and voltage applied to electrodes of the electrostatic chuck.

In some cases a two-step de-chuck sequence is not sufficient to release the workpiece from the chuck. Electrostatic force generated by residual charge may result in workpiece breakage. A helium leak is used as a trigger point indicating if electrical charge has been released from the workpiece and the chuck electrodes. Depending on helium to gently press the workpiece away from the chuck can result in a long de-chuck time or a wide variations in de-chuck times. If the de-chuck process takes too long, then a chamber control system may indicate a chamber fault due to the de-chuck sequence passing a timer setting for the chamber.

The de-chuck time varies with different structures that have been formed on the workpiece, workpiece front and backside coating, and chuck surface condition. While the static charge of the chuck may be easily dissipated, structures on the workpiece may retain some residual charge. This charge then re-establishes a static charge between the workpiece the chuck. Feature size continues to decrease and the transistor structures become increasingly complicated. In addition, transistors are often formed vertically instead of laterally. This increases the ability of the workpiece to store and sustain an electrostatic charge. One such example is VNAND (Vertical Not AND) memory structures that use multiple dielectric layers deposited on the workpiece front and back surfaces. Very high aspect ratio holes are used to make contacts or deep trenches for laying the infrastructure for electrical pathways. In one example, a workpiece is a wafer. Such wafers may take a longer time, i.e. 30 minutes, to process the wafers. The various dielectric coating thickness, material electrical properties, long process times, and ESC surface conditions may cause complex electrical charge distributions at the interface between the wafer and the ESC ceramic layer during wafer processing with electrostatic chucking. All of these factors can require more time to fully release an electrostatic charge from a wafer during a de-chucking process.

As described herein, a wafer or other workpiece can be released or de-chucked from an electrostatic chuck by first supplying helium to the backside of the workpiece to generate a uniform pushing force on the backside of the workpiece. This accelerates the electrical charge applied to the workpiece and releases from the workpiece. A dechuck voltage sequence may also be applied at the same time that the helium pressure is applied to the workpiece.

Figure 1:
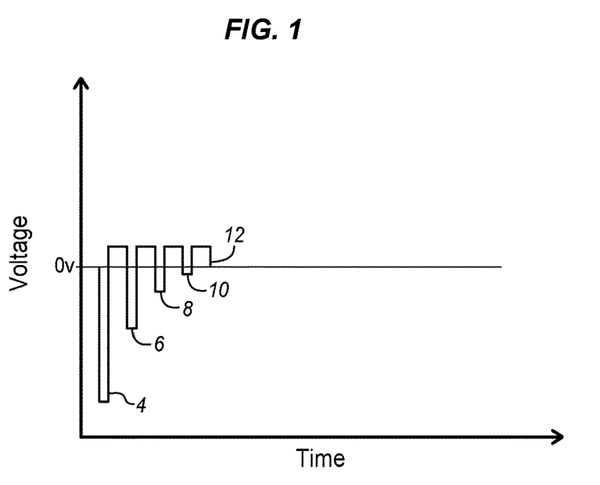
FIG. 1 is diagram of a multiple step voltage pulse swing according to an embodiment.

Shortly thereafter and while the back side gas is still being applied, a multi-step pulse swings through a de-chuck sequence. The voltage is damped with each step. Such a multi-step pulse swing is shown in FIG. 1. In FIG. 1, voltage amplitude is represented on the vertical axis and time is represented on the horizontal axis. The sequence starts with a negative pulse 4. The original chucking voltage (not shown) was positive in this example, so this is followed by a negative voltage for dechucking. If the original chucking voltage had been negative then the de-chucking pulses would be positive and all of the polarities would be reversed as compared to those of FIG. 1. The first negative pulse 4 is followed by a sequence of negative pulses 6, 8, 10. After each negative pulse, the voltage returns to a low positive voltage until the end of the sequence at 12 at which time either a low positive voltage is maintained, or the power is removed and the voltage is allowed to float. The indicated voltage is a voltage applied to the electrodes of the electrostatic chuck.

The initial positive chucking voltage is subjected to charged plasmas, ions, and other electrical sources. The first high negative voltage pulse 4 quickly removes charges built on the workpiece above the dielectric coating of the chuck that continue to accumulate negative charge. The negative pulse generates a reverse coulomb force to balance residual positive electrostatic force, and give the workpiece an impulse pushup. The second low positive voltage between the first 4 and second 6 negative pulses releases the negative charge built during the first negative pulse. The subsequent negative voltage pulses 6, 8 further release the residual charges on the interface between the workpiece and the ESC.

The negative voltage is damped. In the illustrated example, there are four negative pulses and each pulse has half the amplitude of the one before it. The number of pulses and the amount of damping may be adapted to suit different workpieces. The damping or reduction in pulse amplitudes also aids to avoid workpiece pop-up and large workpiece charge shifts. While the illustrated multi-step sequence uses square waves this is chosen to clearly illustrate the principles of the waveform. Other wave forms may alternatively be used. As examples a damped sine wave, a pulse width modulated voltage and other waveforms may be used.

During the application of the multi-step voltage pulse, the helium leak rate may be actively monitored. As helium is pumped against the back side of the workpiece, it will be deflected radially toward the edges of the workpiece and of the chuck. The rate at which the helium flows between the workpiece and the chuck is measured by a helium controller, which measures the flow rate at a constant pressure, and in other ways.

The clamp force between the workpiece and the chuck may be measured by this leak or flow rate. In some examples, if the leak rate is greater than some threshold, then a controller may determine that the workpiece is no longer being held in place. The voltage may be released and lift pins, a manipulator arm or both may be applied to remove the workpiece from the chuck. If the helium leak rate is below the threshold over a specified time, then the system may trigger another pulse swing de-chuck sequence. The multi-step pulse sequence may be repeated until the helium leak rate reaches the threshold or until the system times out and an alert, or fault can be signaled.

Figure 2:
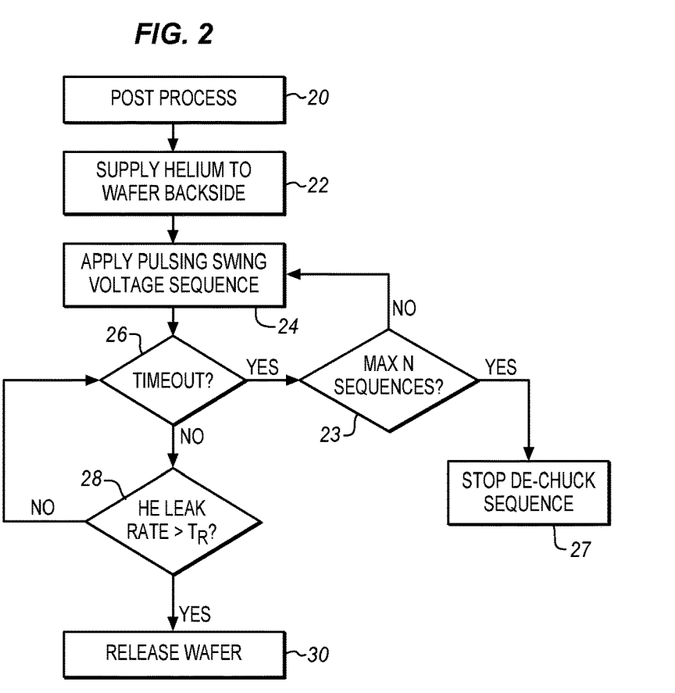
FIG. 2 is a process flow diagram of de-chucking a wafer according to an embodiment of the invention.

FIG. 2 is a process flow diagram for de-chucking a workpiece. The de-chucking process starts as a post process 20 to a processing operation that has been applied the workpiece. While the processing operations are described herein as plasma processes applied to a chucked silicon wafer in a vacuum chamber, the principles herein apply also to other type of processes and workpieces. With the workpiece finished, mechanical force is applied to the back side of the workpiece at 22. This is gentle force that is not sufficient to release the workpiece from the chuck without also applying voltage to the electrodes of the chuck. One type of gentle mechanical force is a gas pressure against the back side of the workpiece. Many electrostatic chucks include a helium supply system to operate as a cooling gas against the back side of the wafer during plasma processing. This same cooling gas conduit may be used to press against the back side of the wafer. Many electrostatic chucks also include lift pins to lift the wafer off the top of the chuck. These may alternatively or additionally be used.

At 24, a pulsing swing voltage is applied to the electrodes of the chuck. These electrodes may be the same electrodes that were used to initially apply an electrostatic force to grip or clamp the chuck before the processing. The pulsing swing voltage may be the same as that of FIG. 1 or may take other forms as described above. The mechanical pressure 22 continues as the voltages are applied.

At 26 there is a timer. The timer is longer than the swing voltage time and expires after the voltage is relaxed. On the expiration of the timer, the pulsing sequence may be repeated at 24. First the number of pulse sequences is counted as each pulse sequence is applied. Before each repeat this number is compared to a maximum threshold at 23. Before the maximum number is reached then the voltage sequence is repeated. After the maximum number of sequences is reached then the de-chucking sequence is stopped at 27. There may be a fault alarm to indicate that the workpiece or process is not operating correctly since the workpiece has not been released. The maximum threshold may vary with different workpiece and process types and with different chucks.

At the same time, before the expiration of the timer, the mechanical pressure from a mechanical actuator such as lift pins or from a gas such as a helium leak rate is checked to determine whether the workpiece is sufficiently released at 28. As an example, the helium leak rate may be compared to a leak rate threshold $T_R$. If the leak rate is below the threshold, then the workpiece is not released and the process returns to the wait for the timer 26. As mentioned above, this release state may be determined by testing the leak rate of an applied gas. If lift pins are used as the pressure, then the pressure against the lift pins may be measured. Other types of mechanical pressure 22 may be tested in other ways. If the workpiece is sufficiently released, then at 30, the workpiece is ejected or removed from the chuck at 30.

Figure 3:
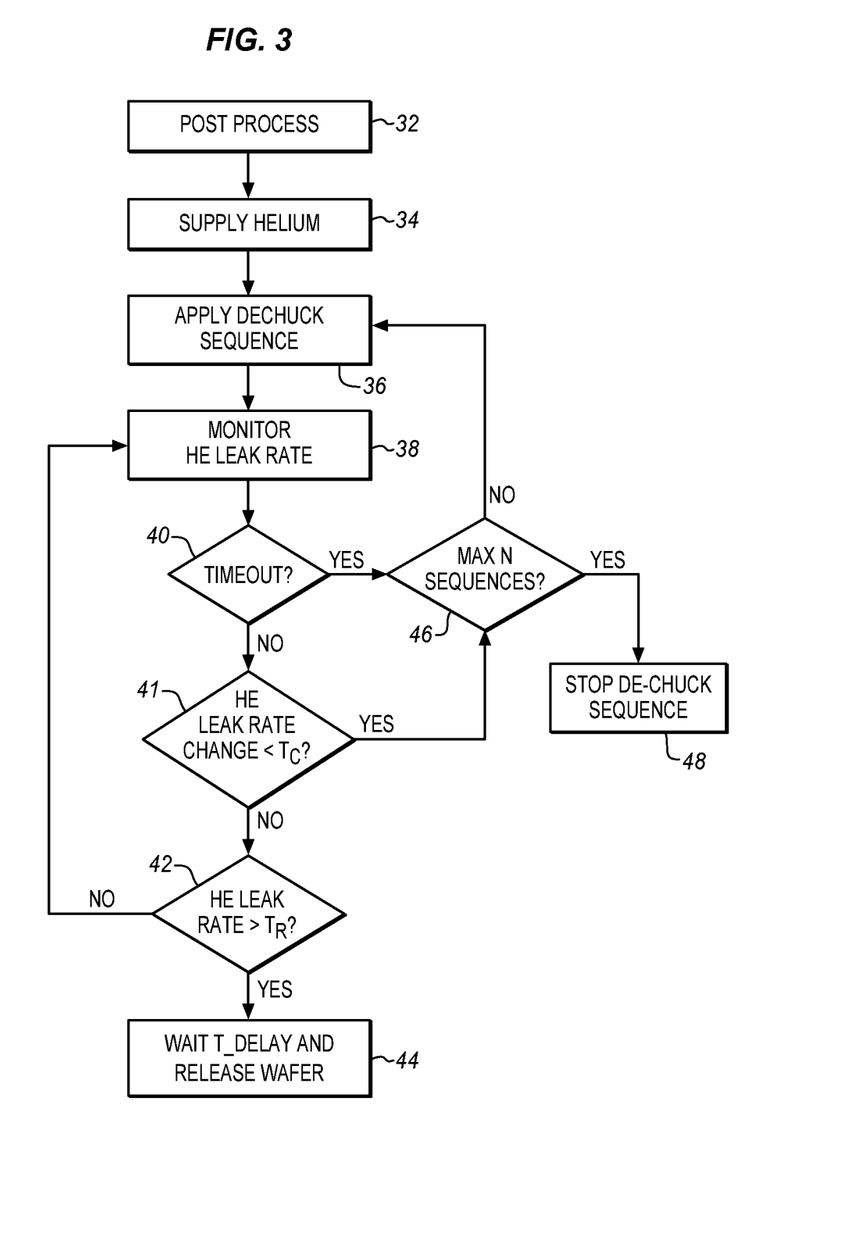
FIG. 3 is an alternative process flow diagram of de-chucking a wafer according to an embodiment of the invention.

FIG. 3 is process flow diagram of an alternative process flow diagram for de-chucking a workpiece. In this example, the start 32 is also after the processing and the de-chucking is then a post process. Again the mechanical pressure is applied 34 to push gently against the back side of the workpiece. Alternatively, the workpiece may be gently pulled from the front side or the edges using a mechanical arm or actuator. The de-chucking voltage sequence is applied 36, such as that of FIG. 1 or various alternatives. At 38 before or after the sequence the helium leak rate or other mechanical parameter is measured. A timer 40 is then applied.

This timer 40, like the timer of FIG. 2 measures the elapsed time from starting the voltage sequence against a threshold. A second decision 41 tests the change of the helium gas leak rate at a specified time. This may be performed in a variety of different ways. In one example, the rate of change in the helium leak rate is compared to a threshold $T_C$. If the change rate is less than the threshold, then the chuck clamping force is not being sufficiently affected and another voltage sequence is necessary to move the reduce the electrostatic force. The change in the leak rate gives an indication as to whether the workpiece is being released. If the leak rate is not changing, then the workpiece is not moving away from the chuck. A similar approach may be used for other types of mechanical force that is being applied to the chucked workpiece.

If either condition, timer expiration or gas leak rate of change, is satisfied, then a yes condition is declared and the multiple step voltage pulse sequence is repeated at 36. Otherwise, a no is declared and the helium leak rate is compared to a leak threshold at 42. As in FIG. 2, this may be done by comparing the leak rate to $T_R$.

This second helium leak rate is not a rate of change test as with the timer at 41, but a current rate test. If the helium is leaking fast enough over leak threshold setting $T_R$, then after a wait, the workpiece is removed at 44. The wait is used to allow the workpiece to continue to work its way free from the chuck before applying a physical force to remove it. If no on condition 42, the sequence moves back to step 38.

If the timeout has occurred at 40 and the rate of change is small at 41, then before the next voltage sequence, the number of sequences already used is compared to the maximum allowed. If the maximum number of sequences has been reached, then the de-chuck sequence is stopped at 48. The system can send an alarm or declare a fault or alert.

The FIG. 3 process may be understood in terms of several parameters that may be modified to suit different chamber conditions and to suit different workpiece types. First there are the various voltages of the multiple step voltage sequence. These may be designated as V1, de-chuck voltage 1, V2, de-chuck voltage 2, etc. There are also timers for the processes, such as T1, a first de-chuck used to finish the multiple step voltage sequence and T2, a duration measured by the timer 40.

There may be a leak rate threshold, $T_R$, used to determine whether the leak rate is sufficient at 42. There may be a leak rate of change threshold $T_C$ used by the timer 40 to see if the workpiece is starting to come free. A parameter Ns, a de-chuck swing cycle number, may be used to determine how many multiple step voltage sequences have been applied. This may be compared to a threshold N, a maximum number of de-chuck sequences that are permitted before a fault is applied. Td may be used to designate the delay time after satisfying the He leak threshold at 42 before the workpiece is removed at 44.

Considering these parameters more closely in FIG. 3, at 36, Ns is initialized at start and incremented for each repetition from the timer. The multiple step voltage sequence 36 uses parameters V1, V2, V3, etc. and T1, etc. to drive the voltage sequence. The timer 40 uses the timeout timer T2 and the gas leak rate of change $T_C$ thresholds to determine a yes or a no. The gas leak rate threshold $T_R$ is applied to determine whether the workpiece is released, and if so then a timer Td is used to determine when to remove the workpiece.

The parameter Ns introduces another criterion. Before the return loop is applied from 40 to 36, the sequence count Ns is checked. If a sequence count threshold is exceeded, then instead of repeating the multiple step voltage sequence, an alert is triggered. An operator is alerted to determine if there is a fault in the process, the chuck, or the workpiece. Alternatively, the workpiece may be flagged as defective. In either event, the workpiece must be removed from the chuck so that the chuck may be reused.

Figure 4:
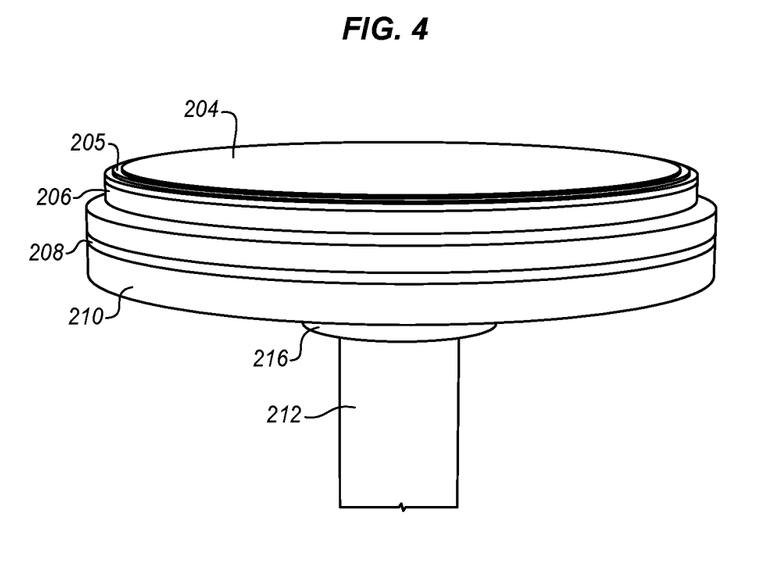
FIG. 4 is an isometric top view of an electrostatic chuck in accordance with an embodiment of the invention.

FIG. 4 is an isometric view of an assembled ESC suitable for use with the processes described above. A support shaft 212 supports a base plate 210 through a thermal isolator 216. A cooling plate 208 and a heater plate 206 are carried by the base plate. A top heater plate 206 carries a puck 205 on the top surface of the heater plate. A workpiece 204, such as a silicon substrate, glass sheet, or other material (not shown) is in turn carried above the puck and may be attached electrostatically.

The primary support shaft 212 supports the base plate 210 with an isolated thermal break 216 between the support shaft and the base plate. The shaft is hollow inside and includes conduits for conductors, gases and other materials that are supplied to the top of the chuck. The base plate supports the cooling plate 208. The cooling plate is typically machined from aluminum and then covered with elastomer caps for each of the cooling channels.

The cooling plate absorbs heat from the workpiece through the dielectric puck 205 and the top plate 206. It also absorbs heat from the top plate heaters. The top surface 205 of the top plate 206 is bonded to the dielectric puck 205 with a high temperature adhesive, such as silicone. The puck is typically ceramic but may alternatively be made with other materials. Electrodes (not shown) are embedded within the puck to generate an electrostatic field with which to grip a workpiece, such as a silicon substrate.

The base plate 210 provides a structural reinforcement to the cooling plate 208. The base plate may be formed from a rigid material that has poor thermal conductivity or a lower thermal conductivity compared to the cooling plate. This prevents heat flow between cooling channels through the base plate. The base plate may be formed from polystyrene, titanium, alumina, ceramic, stainless steel, nickel, and similar materials. It may be formed of a single piece or several parts brazed together. The base plate may be bolted, screwed or riveted to the cooling plate, depending on the particular implementation.

The base plate 210 is carried on a shaft 212. The shaft is hollow inside and includes conduits for conductors, gases and other materials that are supplied to the top of the chuck. An isolator 216 is placed between the metal shaft and the metal base plate 210 to reduce the conduction of heat between the shaft and the base plate. This keeps the shaft cooler and also shields heat from any handling mechanism that may be attached to the shaft.

While the present description is presented in the context of an electrostatic chuck such as the one shown in FIG. 4, the approaches and techniques may be applied to other types of electrostatic carrier, clamps, and pedestals. In some embodiments, the chuck does not include the heaters, cooling plates and other conduits but is used as a carrier for thinned wafers. The carrier is then held by a vacuum, electrostatic or other type of chuck. The de-chucking approach described herein may be used to remove a workpiece from the carrier and also to remove the carrier from a chuck.

Figure 5:
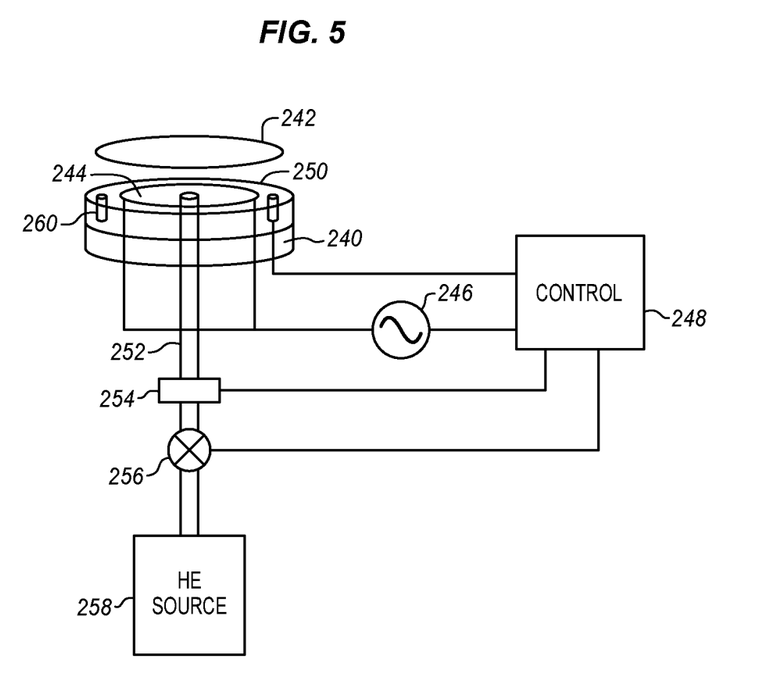
FIG. 5 is a diagram of de-chucking system for an electrostatic chuck in accordance with an embodiment of the invention.

FIG. 5 is a diagram of a de-chucking system using a cooling gas supply and a controlled voltage source with an ESC. An ESC 240 acts as a support for a workpiece 242 and may be within a processing chamber or removed from the processing chamber with the workpiece 242 attached to its top plate. The workpiece may be a silicon wafer, or another type of workpiece such as gallium arsenide, lithium niobate, ceramic and other materials.

The chuck 240 may have a construction similar to that of FIG. 4 and may include heating, cooling, and other features not shown in this diagram. The chuck includes electrodes 244 which may be in the form of a dipolar hemisphere or in any of a variety of other configurations that are connected through electrodes 243 to voltage source or power supply 246. The power supply is regulated or commanded by a controller 248 to generate the various multiple step pulses as described herein.

The chuck also has one or more cooling gas outlets 250 at the top of the puck to direct air against the back side of the workpiece 242. The gas outlets may be in any number and configuration depending on the design of the particular chuck. The chuck includes gas inlet fittings to allow a supply tube 252 to be coupled to a cooling gas source 258, such as a Helium source. The He source provides the cooling gas under pressure to a control valve 256. The gas flows from the source to the control valve and then through a flow rate detector 254 to the chuck. The flow rate detector measures the flow rate of the gas which is directly related to the gas leakage rate. It may also measure the gas pressure. These results are provided to the connected controller 248 which may then control the valve 256 and operate the processes of FIGS. 2 and 3. Alternatively the detector 243 may be a part of the valve or the gas source.

The chuck also has lift pins 260 that may be connected through electrical connectors 243 to the controller 248 to operate in pushing the workpiece off of the chuck. These components operate together to accomplish the functions described above to de-chuck the workpiece.

As shown in the figure, the de-chucking system operates on an electrostatic chuck that has electrodes that are used to apply the electrostatic clamping force to the workpiece. There is a mechanical actuator coupled to the chuck to apply a mechanical force against the back side of the workpiece that is electrostatically clamped to the chuck. This may be a gas or a physical structure like a lift pin a robot arm or some other actuator on the back side, the edges or even a vacuum chuck on the front side. There is the power supply coupled to the chuck to apply voltages to the electrodes of the chuck and then a controller to drive the power supply. The power supply applies a sequence of voltage pulses with a same polarity to the electrodes. Each pulse of the sequence has a lower voltage than the preceding pulse. The controller determines whether the workpiece is released from the chuck after the sequence of additional voltage pulses and if the workpiece is not released then the controller drives the power supply to repeat applying the sequence of voltage pulses.

Figure 6:
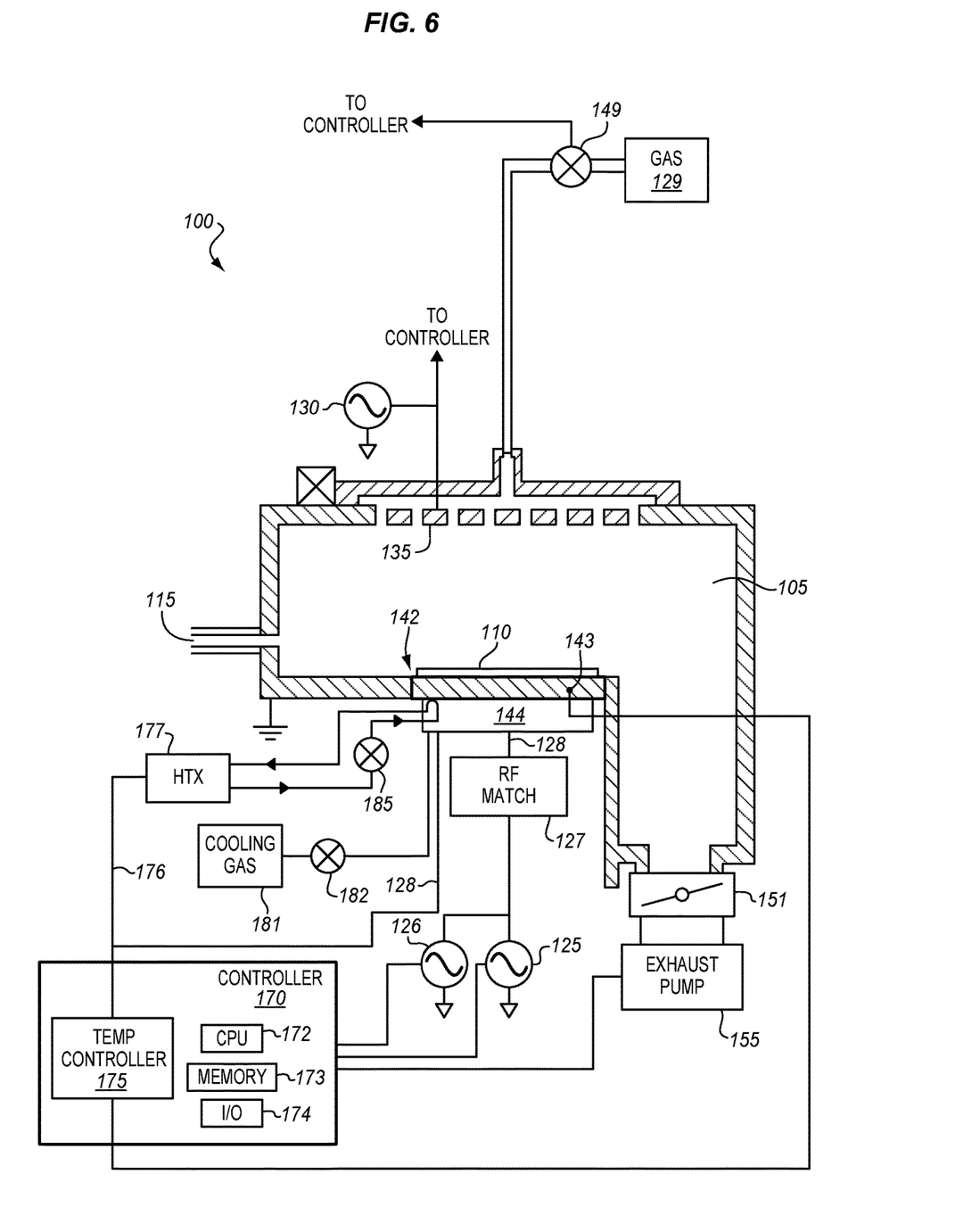
FIG. 6 is a schematic of a plasma etch system including a chuck assembly in accordance with an embodiment of the invention.

FIG. 6 is a schematic of a plasma etch system 100 including a chuck assembly 142 in accordance with an embodiment of the present invention. The plasma etch system 100 may be any type of high performance etch chamber known in the art, such as, but not limited to, Enabler®, DPS II®, AdvantEdge™ G3, EMAX®, Axiom®, or Mesa™ chambers, all of which are manufactured by Applied Materials of California, USA. Other commercially available etch chambers may similarly utilize the chuck assemblies described herein. While the exemplary embodiments are described in the context of the plasma etch system 100, the chuck assembly described herein is also adaptable to other processing systems used to perform any plasma fabrication process (e.g., plasma deposition systems, etc.)

Referring to FIG. 6, the plasma etch system 100 includes a grounded chamber 105. Process gases are supplied from gas source(s) 129 connected to the chamber through a mass flow controller 149 to the interior of the chamber 105. Chamber 105 is evacuated via an exhaust valve 151 connected to a high capacity vacuum pump stack 155. When plasma power is applied to the chamber 105, a plasma is formed in a processing region over a workpiece 110. A plasma bias power 125 is coupled into the chuck assembly 142 to energize the plasma. The plasma bias power 125 typically has a low frequency between about 2 MHz to 60 MHz, and may be, for example, in the 13.56 MHz band. In an example embodiment, the plasma etch system 100 includes a second plasma bias power 126 operating at about the 2 MHz band which is connected to an RF (Radio Frequency) match 127. The plasma bias power 125 is also coupled to the RF match and also coupled to a lower electrode via a power conduit to supply the drive current 128. A plasma source power 130 is coupled through another match (not shown) to a plasma generating element 135 to provide high frequency source power to inductively or capacitively energize the plasma. The plasma source power 130 may have a higher frequency than the plasma bias power 125, such as between 100 and 180 MHz, and may, for example, be in the 162 MHz band.

A workpiece 110 is loaded through an opening 115 and clamped to the chuck assembly 142 inside the chamber. The workpiece 110, such as a semiconductor wafer, may be any wafer, substrate, or other workpiece employed in the semiconductor processing art and the present invention is not limited in this respect. The workpiece 110 is disposed on a top surface of a dielectric layer or puck of the chuck assembly that is disposed over a cooling base assembly 144 of the chuck assembly. A clamp electrode (not shown) is embedded in the dielectric layer. In particular embodiments, the chuck assembly 142 includes electrical heaters (not shown). The heaters may be independently controllable to the same or to different temperature set points.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The temperature controller receives temperature information from a thermal sensor 143 in the chuck and then adjusts the heaters and heat exchangers accordingly. While only one thermal sensor is shown, there may be many more in many different locations, depending on the particular implementation. The system controller 170 also includes a central processing unit 172, memory 173 and input/output interface 174. The temperature controller 175 is to output control signals or drive current 128 to the heaters affecting the rate of heating and therefore the rate of heat transfer between each heater zone of the chuck assembly 142 and the workpiece In embodiments, in addition to the heaters, there may be one or more coolant temperature zones. The coolant zones have heat transfer fluid loops with flow control that is controlled based on a temperature feedback loop. In the example embodiment, the temperature controller 175 is coupled through a control line 176 to a heat exchanger (HTX)/chiller 177 depending on the particular implementation. The control line may be used to allow the temperature controller to set a temperature, flow rate, and other parameters of the heat exchanger. The flow rate of the heat transfer fluid or coolant through conduits in the chuck assembly 142 may alternatively or additionally be controlled by the heat exchanger.

One or more valves 185 (or other flow control devices) between the heat exchanger/chiller 177 and fluid conduits in the chuck assembly 142 may be controlled by the temperature controller 175 to independently control a rate of flow of the heat transfer fluid. The temperature controller may also control the temperature set point used by the heat exchanger to cool the heat transfer fluid.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers.

While the present description describes a vacuum chuck in the context of a plasma processing chamber, the principle, structures, and techniques described herein may be used with a variety of different workpiece supports, in a variety of different chambers and for a variety of different processes.

The processing system 100 also includes cooling gas source 181 that is coupled through a control valve 182 to the chuck assembly 142. The cooling gas source may be a source of He or any other suitable gas to conduct heat between the puck and the workpiece to conduct heat away from the workpiece. The cooling gas source may also be coupled to other components for other purposes. As described, the gas is supplied to the chuck and flowed against the back side of the workpiece. A separate source of reactive gases 129 is provided to support the fabrication processes being applied to the workpiece 110. The cooling gas source may be used to support other processes, depending on the particular implementation.

In operation, a workpiece is moved through the opening of the chamber and attached to the puck of the carrier for fabrication processes. Any of a variety of different fabrication process may be applied to the workpiece while it is in the processing chamber and attached to the carrier. During the process and optionally before the process, the dry gas is supplied under pressure to the dry gas inlet of the base plate. The pressure pushes the dry gas into the space between the base plate and the cooling plate. The gas flow drives the ambient air from between the base plate and the cooling plate.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method comprising: applying a mechanical force from an electrostatic chuck against the back side of a workpiece that is electrostatically clamped to the chuck; applying a sequence of voltage pulses with a same polarity to electrodes of the chuck, each pulse of the sequence having a lower voltage than the preceding pulse; determining whether the workpiece is released from the chuck after the sequence of additional voltage pulses and if the workpiece is not released then repeating applying the sequence of voltage pulses.

2. The method of claim 1, wherein the mechanical force is a pressure from a pin pressing against the back side of the workpiece.

3. The method of claim 1, wherein the mechanical force is a gas applied at pressure against the back side of the workpiece and wherein determining whether the workpiece is released comprises determining a gas leak rate and comparing the gas leak rate to a threshold.

4. The method of claim 3, wherein determining the gas leak rate comprises measuring the flow rate of the gas against the back side of the workpiece.

5. The method of claim 3, further comprising determining the rate of change of the gas leak rate and comparing the rate of change to a threshold and if the rate of change is more than the threshold then not repeating the applying the sequence of voltage pulses.

6. The method of claim 3, wherein the gas is a helium cooling gas.

7. The method of claim 1, wherein the lower voltage of each pulse is half the voltage of the preceding pulse.

8. The method of claim 1, wherein a first voltage pulse of the sequence has an amplitude and duration to remove charges accumulated on the workpiece.

9. The method of claim 1, wherein a second voltage pulse of the sequence has an amplitude and duration to release charges caused by the first voltage pulse.

10. The method of claim 1, wherein a voltage of a second opposite polarity is applied between each of the additional voltage pulses.

11. The method of claim 1, further comprising applying lift pins against the back side of the workpiece if the workpiece is released from the chuck.

12. The method of claim 1, further comprising determining a number of times of repeating applying the sequence and if the number exceeds a threshold, then declaring a fault.

* * * * *